US006417115B1

(12) United States Patent
McDevitt et al.

(10) Patent No.: US 6,417,115 B1
(45) Date of Patent: Jul. 9, 2002

(54) TREATMENT OF DIELECTRIC MATERIALS

(75) Inventors: Terrence Alair McDevitt, Ijamsville; Robert Douglas Mohondro, Sykesville, both of MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/084,238

(22) Filed: May 26, 1998

(51) Int. Cl.[7] .................................................. G03F 7/00
(52) U.S. Cl. ........................ 438/778; 438/240; 438/758; 438/772
(58) Field of Search ................................ 438/240, 758, 438/772, 778

(56) References Cited

U.S. PATENT DOCUMENTS

| 4,507,587 | A | | 3/1985 | Wood et al. | |
|---|---|---|---|---|---|
| 4,548,688 | A | | 10/1985 | Matthews | |
| 4,794,503 | A | | 12/1988 | Wooten et al. | |
| 5,436,084 | A | * | 7/1995 | Haluska et al. | 428/688 |
| 5,970,384 | A | | 10/1999 | Yamazaki et al. | |
| 6,025,222 | A | * | 2/2000 | Kimura et al. | 438/240 |
| 6,057,084 | A | | 5/2000 | Mohondro | |

FOREIGN PATENT DOCUMENTS

| EP | 0426715 A1 | 12/1991 |
|---|---|---|
| EP | 0575650 A1 | 12/1993 |
| EP | 0816925 A1 | 7/1998 |

OTHER PUBLICATIONS

Patent Abstract of Japan, Applicant, Dow Corning Asia KK; Inventor, Tachikawa Mamoru, Title, Ultraviolet–Curing Composition and Cured Body Pattern Method Using the Same.
European Search Report.
* cited by examiner

*Primary Examiner*—Charles Bowers
*Assistant Examiner*—Lisa Kilday

(57) ABSTRACT

A method of treating a dielectric material deposited on a substrate in semiconductor device manufacturing processes. The dielectric material is exposed to radiation. The dielectric material is exposed to a temperature of 20° C. or greater. The dielectric material is exposed to an atmosphere that includes at least one material selected from the group consisting of an amine, an amide, at least one aldehyde, at least one aromatic compound and $N_2$.

20 Claims, 2 Drawing Sheets

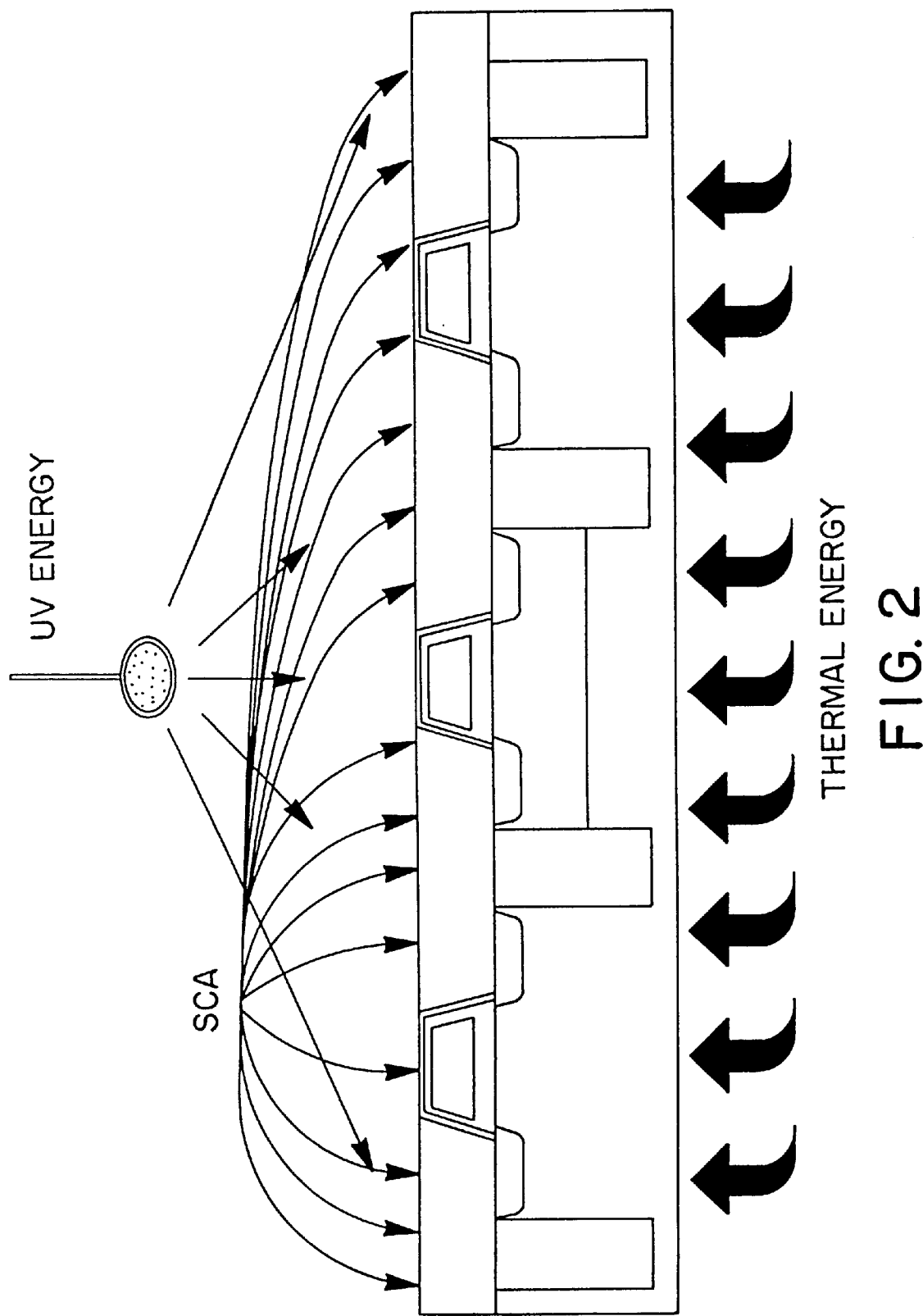

TREATMENT OF DIELECTRIC MATERIALS

FIELD OF THE INVENTION

The invention relates to a process for treating dielectric materials during semiconductor device manufacture to control the dielectric constant of the dielectric materials. The invention also relates to methods and apparatus for forming semiconductor devices and treated dielectric materials.

BACKGROUND OF THE INVENTION

Microelectronic devices such as integrated circuits, are manufactured by means of photolithographic techniques. Fabricating various structures, particularly electronic device structures, typically involves depositing at least one layer of at least one photosensitive material, typically known as a photoresist material, on a substrate. The photoresist material may then be patterned by exposing it to radiation of a certain wavelength or wavelengths to alter characteristics of the photoresist material. Typically, the radiation is from the ultraviolet range of wavelengths. The radiation causes desired photochemical reactions to occur within the photoresist.

The photochemical reactions alter the solubility characteristics of the photoresist, thereby allowing removal of certain portions of the photoresist. Selectively removing certain parts of the photoresist allows for the protection of certain areas of the substrate while exposing other areas. The remaining portions of the photoresist typically are utilized as masks or stencils for processing the underlying portions of the substrate.

An example of such a process is in the fabrication of semiconductor devices wherein, for example, layers are formed on a semiconductor substrate. Certain portions of the layers may be removed to form openings through the layers. The openings may allow diffusion of desired impurities through the openings into the semiconductor substrate. Other processes are known for forming devices on a substrate.

At times during semiconductor device manufacture, prior or subsequent to the deposition of photoresist on a substrate, other materials may be deposited on the substrate. Examples of such material include electrical conductors and electrical insulators. Electrical insulators typically include a wide variety of dielectric materials. These dielectric materials may be treated during the process of formation of the semiconductor device. Other materials may also be deposited on the dielectric materials.

For example, semiconductor devices may be formed by introducing a suitable impurity into a layer of a semiconductor to form suitably doped regions therein. In order to provide distinct P or N regions, which are necessary for the proper operation of the device, introduction of impurities should occur through only a limited portion of the substrate. Usually, this is accomplished by masking the substrate with a resist material and subsequently etching a diffusion resistant material, such as silicon dioxide or silicon nitride to a desired depth to form a protective mask to prevent diffusion of the impurities through selected areas of the substrate.

The mask in such a procedure is typically provided by forming a layer of material over the semiconductor substrate and, afterward creating a series of openings through the layer to allow the introduction of the impurities directly into the underlying surface. These openings in the mask are readily created by coating the silicon wafer with a material known as a photoresist. After forming features in the photoresist, electronic device features may be formed in or on the substrate upon which the photoresist is deposited. In addition, one or more of these deposited layers may be treated or altered prior to or after etching to maintain or enhance their performance related to the functionality of the specific semiconductor device.

SUMMARY OF THE INVENTION

Aspects of the present invention provide a process for treating a dielectric material deposited on a substrate in semiconductor device manufacturing processes. According to the method, the dielectric material is exposed to radiation.

The dielectric material is also exposed to a temperature of 20° C. or greater. Additionally, the dielectric material is exposed to an atmosphere that includes at least one material selected from the group consisting of an amine, an amide, an aldehyde, an aromatic compound and $N_2$.

According to other aspects, the present invention provides a device for treating a dielectric material deposited on a substrate in semiconductor device manufacturing processes. The device includes a source of radiation for exposing the dielectric material to radiation. The device also includes a heat source for exposing the dielectric material to a temperature of 20° C. or greater. A chamber having a controlled atmosphere is used for exposing the dielectric material to an atmosphere that includes at least one material selected from the group consisting of air, an amine, an amide, an aldehyde, an aromatic compound and $N_2$.

Additional aspects of the present invention provide a semiconductor device prepared according to a process that includes the above-described process for treating a dielectric material.

Also, aspects of the present invention provide a method for preparing a semiconductor device that includes the above process for treating a dielectric material.

Further aspects of the present invention provide a treated dielectric material that has been treated according to the above-discussed process for treating a dielectric material.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 2 represents a cross-sectional view of another point in the manufacture of a semiconductor device where a method according to the present invention may be utilized.

DETAILED DESCRIPTION OF THE INVENTION

Figure 1:
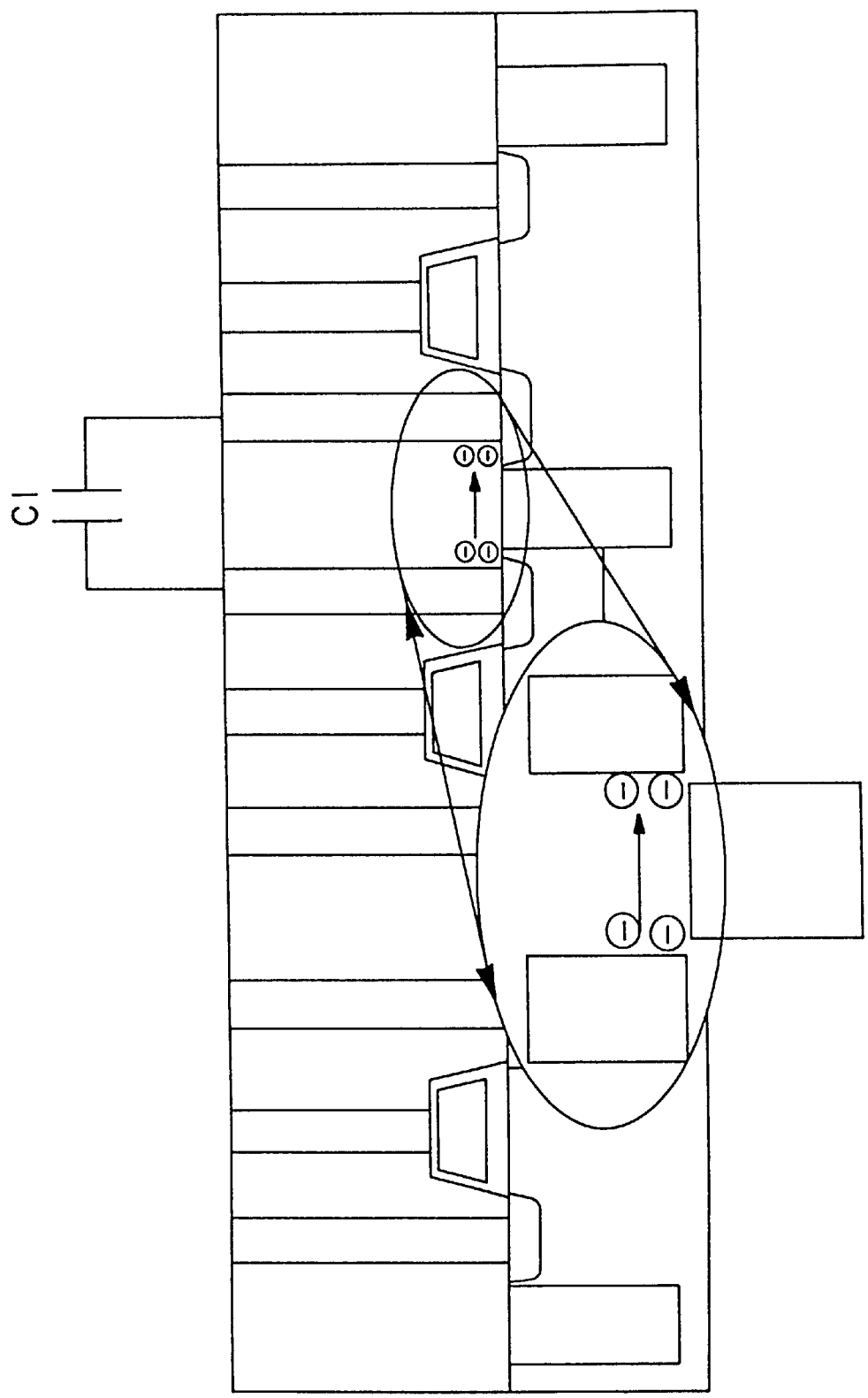
FIG. 1 represents a cross-sectional view of a point in the manufacture of a semiconductor device where a method according to the present invention may be utilized.

Methods according to the present invention may be considered an extension of the photostabilization process that is commonly utilized to stabilize photoresist after formation of features in the photoresist. Photostabilization typically is a post-lithography process that can maintain resist feature sidewall profiles, minimize outgassing, minimize blistering, minimize resist popping and reduce resist residue and particles. Photostabilization makes photolithographic features more rigid and more robust so as to make them more resistant to subsequent processing. Photostabilization can also reduce process delays. Photostabilization is described in U.S. Pat. No. 4,548,688 issued Oct. 22, 1985, to Matthews for Hardening of Photoresist and Apparatus, the entire disclosure of which is hereby incorporated by reference.

Photostabilization utilizes electromagnetic energy, photons, typically in the Deep UV range and heat to cure or densify a photoresist. Preferably, the heat is applied by ramping up the temperature. In the context of photoresist, under photostabilization, the photoresist is subjected to UV radiation while simultaneously being heated. The radiation and heat initiates chemical cross-linking reactions within the resist.

Typically, the substrate and photoresist are subjected to processes such as etch and implant directly after the formation of features in the photoresist, such as by photolithography. Processes such as etch and implant can have effects on the substrate and materials deposited on the substrate, such as dielectric materials in addition to the desired effects. For example, the dielectric constant of dielectric materials may be altered. Such alterations may include raising the dielectric constant. Regardless of how the dielectric constant is changed, if the dielectric or other material has characteristics that are altered from those that the materials are known to possess, the materials may act differently in the processing and operation of the semiconductor device. The present invention is at least in part a directed process for helping to prevent the alteration of materials such as dielectric materials during semiconductor device manufacture.

The radiation may be provided by any suitable radiation source. According to one example, the radiation source utilized is a microwave electrodeless light source, the light source including a lamp structure having a maximum dimension less than a wavelength of radiation produced by the light source.

Methods according to the present invention may include exposing dielectric materials deposited on a substrate or on other material(s), or other dielectric material(s) deposited on a substrate during semiconductor device manufacture to radiation, temperatures above room temperature, and/or various gaseous and/or vaporous materials. The present invention may include any combination of exposing the dielectric material(s) to radiation, elevated temperatures and/or one or more gaseous and/or vaporous substances. The exposing may take place simultaneously or sequentially in any order. Details of the various parameters that may be utilized are discussed in greater detail below.

According to one embodiment, the exposure to elevated temperatures may take place after beginning the exposure to radiation such that the exposure to increased temperature may take place upon an increase in the degree of densification and/or planarity due to the exposure to the radiation.

The end result of the processes according to the present invention is to control or enhance, at least temporarily, the dielectric constant of the dielectric material(s). Such control may include maintaining the dielectric constant, such that any subsequent processing of the substrate on which the dielectric material has been deposited does not change the dielectric constant of the dielectric material. According to other embodiments of the present invention, the dielectric constant of the dielectric materials may be altered. Typically, such alteration includes lowering the dielectric constant. Although, for some purposes, the dielectric constant may be raised.

Methods according to the present invention of treating dielectric materials may alter the structure of the dielectric materials. For example, some atoms in the structure could be eliminated from the structure of the dielectric materials. According to other embodiments, another atom or atoms could be substituted in place of some atoms in the structure of the dielectric materials. Alternatively, atoms or one or more elements may be added to the structure of the dielectric materials.

According to some embodiments of the present invention may result in one or more materials being deposited on the surface or impregnate the structure of the dielectric materials. Such materials may adhere to the dielectric materials through weak chemical bonds, such as hydrogen bonds or van der Waals' forces. For example, a material from a substance in a gaseous or vaporous form could adhere to a surface of a dielectric material.

The present invention may be utilized and have effectiveness with all dielectric materials. The present invention may be particularly useful with dielectric materials that have a dielectric constant of at least 4.0. Such dielectric materials could include silicon dioxide ($SiO_2$), silicon nitride (SiN), ditantalum pentoxide ($Ta_2O_5$), and barium strontium tantalum (BST). Such materials typically are considered to have a high dielectric constant.

Other dielectric materials that the present invention may be utilized with include dielectric materials that have a dielectric constant of 3.0 or less. Such dielectric materials typically are considered to have a low dielectric constant. Examples of such materials include silicon oxygen fluorine (SiOF), hydrosilsesquioxane ($H_8Si_8O_{12}$), aerogels, BCB, and nanoporous silica. Hydrosilsesquioxane has the following structure:

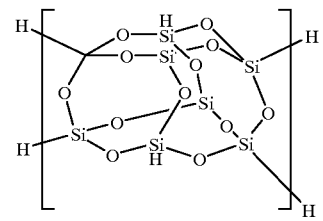

The type of dielectric involved may depend at least in part upon the type of device being formed. For example, in a logic device, it may be desirable to utilize materials with a low capacitance. On the other hand, in memory devices it typically is beneficial to utilize materials that highly retain a stored charge.

The meaning of "enhance" herein with respect to the effects of the present invention may depend upon the dielectric constant of the material involved. For example, in the context of materials having a "low" dielectric constant, "enhance" typically means that the dielectric constant is decreased. On the other hand, for materials having a "high" dielectric constant, "enhance" may involve increasing the dielectric constant.

Processes according to the present invention may be utilized in any semiconductor device manufacturing process. Examples of two devices include integrated circuit manufacture and flat panel display manufacture.

As stated above, the present invention may include treating dielectric materials by exposing the dielectric materials to radiation. The radiation may be of various wavelengths. One criteria that may be utilized to select the wavelength(s) and other characteristics of radiation utilized includes the amount of energy that the radiation may impart to the dielectric materials. Typically, just as photostabilization as applied to photoresist, radiation with wavelengths in the ultraviolet (UV) range is utilized in methods according to the present invention. Particularly useful are wavelengths in the deep UV range.

The radiation utilized and the time over which the dielectric material(s) is exposed to the radiation may vary, depending upon the process. Typically, the characteristics of the radiation and time period are sufficient to carry out the desired treatment of the dielectric material. The photostabilization process as defined previously, describes examples of radiation and process parameters involved in the provision of the radiation.

As stated above, the present invention may also include exposing the dielectric material to temperatures above about 20° C. The photostabilization process as defined previously, describes examples of elevated temperatures and process parameters involved in the provision of the elevated temperatures. The exposure to elevated temperatures may take place simultaneously or sequentially with the exposure to radiation.

The present invention may also include exposure of dielectric material to an atmosphere that includes at least one material selected from the group consisting of at least one amine, at least one amide, at least one aldehyde, at least one aromatic compound and $N_2$.

According to one embodiment of the process according to the present invention, dielectric material that has been deposited on a substrate or on another dielectric material or any other material that has been deposited on a substrate is exposed to at least one amine. It has also been discovered that the dielectric material may also be exposed to at least one amide, at least one aldehyde, at least one aromatic compound and/or nitrogen.

The use of at least one amine, at least one amide, at least one aldehyde, at least one aromatic compound and/or nitrogen may be in a vaporous or gaseous form. The at least one amine, at least one amide, at least one aldehyde, at least one aromatic compound and/or nitrogen may also be in a mixture of gases. The total concentration may range from less than about 1% in combination with an inert gas or vapor. Alternatively, at least one amine, at least one amide, at least one aldehyde, at least one aromatic compound and/or nitrogen may be used in higher concentrations as may be necessary to result in the desired treatment of the dielectric constant of the dielectric material. For example, to control the dielectric constant. This concentration may be as high as 100% amine, amide, aldehyde, aromatic compound and/or nitrogen for certain applications and for certain dielectric materials.

Amine as used herein may include ammonia ($NH_3$) and/or one or more organic amines. The amine(s) that the dielectric material may be exposed to may include any one or more amine(s). The amines may be primary, secondary or tertiary. Examples of specific amines that may be used include $RNH_2$, $R_2NH$, $R_3N$, where R may be any hydrocarbon substitute. For example, R, $R_2$, and $R_3$ may be alkyl groups. Typically, the R, $R_2$, and $R_3$ may be alkyl groups having from 1 to 12 carbon atoms. More typically, R, $R_2$, and $R_3$ may be an alkyl group of from 1 to 6 carbon atoms. One example of an alkyl group is a methyl group.

As stated above, also included, in addition to or in place of the at least one amine can be at least one aldehyde and/or at least one amides ($R_1$—NCO—$R_2$). One example of an aldehyde is formaldehyde. Typically, such aldehydes include from 1 to 12 carbon atoms. More typically, the aldehydes have from 1 to 6 carbon atoms.

In the case of amides, $R_1$ and $R_2$ may be any hydrocarbon substitute. For example, $R_1$ and $R_2$ may be alkyl groups. Typically, $R_1$ and $R_2$ may be alkyl groups having from 1 to 12 carbon atoms. More typically, $R_1$ and $R_2$ may be alkyl groups of from 1 to 6 carbon atoms. One example of an alkyl group is a methyl group. One example of an amide is 2N-methyl pyrrolidone, commonly known as NMP.

Examples of aromatic compounds that could be utilized according to the present invention include benzene, benzene containing compounds, substituted benzenes, where the substituents are attached to the benzene molecule(s) or substituted for one or more of the carbon atoms in the benzene structure.

Of course, the amine, amide, aldehyde, aromatic compound and/or nitrogen utilized may depend upon a variety of factors. For example, certain amines, amides, aromatic compounds, and/or aldehydes may be more effective with certain dielectric materials based upon the structure of the amine, amide, aromatic compound or aldehyde and the structure of the dielectric material. Determining which amines, amides, aldehydes, aromatic compounds and/or nitrogen are most suitable for a specific dielectric material and a specific process is certainly within the scope of routine examination by one skilled in the art and once aware of the present disclosure.

Additionally, prior to carrying out a process according to the present invention, a profile of effects of processing on a dielectric material may be determined. The profile may include the amount of change typically experienced in the dielectric constant when exposing the dielectric material to further processing in semiconductor device manufacture, such as etch, implant, and/or other processes. Once aware of the present disclosure, one skilled in the art could determine the profile of a dielectric material without undue experimentation.

According to embodiments of the present invention, the dielectric material may be subjected to the at least one amine, at least one amide, at least one aldehyde, at least one aromatic compound and/or nitrogen for a time of from about 10 seconds to about 300 seconds. The period of time that the dielectric material may be exposed to the amine(s) may vary, depending upon the dielectric material the amine, amide, aldehyde, aromatic compound and/or nitrogen and the desired effect on the dielectric material, among other factors. The period of time that the dielectric material is exposed to the at least one amine, at least one amide, at least one aldehyde, at least one aromatic compound and/or nitrogen may be long enough to impregnate and/or coat a majority of the dielectric material with the at least one amine, at least one amide, at least one aldehyde, at least one aromatic compound and/or nitrogen. Alternatively, the period of time that the dielectric material is exposed to the at least one amine, at least one amide, at least one aldehyde, at least one aromatic compound and/or nitrogen may be sufficient to control the amount of change in the dielectric constant experienced in the dielectric material during processing occurring after deposition of the dielectric material.

During processes according to the present invention, the dielectric material may be subjected to UV radiation and a controlled ramp to an elevated temperature as required by the specific process while additionally being subjected to at least one amine, at least one amide, at least one aldehyde, at least one aromatic compound and/or nitrogen vapor or gas. This process may help to minimize change in the dielectric material during subsequent processing, such as etch or ion implant.

Additionally, it may be a requirement to process wafers including dielectric material during a process according to the present invention with the use of at least one amine, at least one amide, at least one aldehyde, at least one aromatic compound and/or nitrogen in a sub-atmospheric or vacuum chamber. According to such processes, the wafer may be placed into a processing chamber. The pressure could then be reduced to a certain level. For example, the pressure may be reduced to a level in the range of from about 12 torr to about $10_{-5}$ torr. Alternatively, the pressure may be reduced to a level in the range of from about 12 torr to about $10_{-3}$ torr or to a level in the range of from about $10^{-3}$ torr to about $10^{-5}$ torr. After reducing the pressure, the process according to the present invention would begin. Before, during or after beginning the process according to the present invention, at least one amine, at least one amide, at least one aldehyde, at least one aromatic compound and/or nitrogen vapor or gas may be introduced into the processing chamber to realize the desired effect on the dielectric material.

This reduced pressure requirement may be included as an alternative method deviation from the photostabilization process described by Matthews, referred to above. According to the present invention, the process should work in both atmospheric and sub-atmospheric conditions. However, a sub-atmospheric or vacuum chamber may be a requirement for some end users. The use of a sub-atmospheric or vacuum chamber does not change the premise of this disclosure or invention, or end process results. Therefore, operating in a sub-atmospheric or vacuum chamber is illustrative of one way to carry out the processes of the present invention, not the only way.

The present invention also includes methods for forming semiconductor chip devices. According to the methods, dielectric materials are deposited on and/or in portions of a substrate or materials deposited on a substrate, such as a semiconductor wafer. More details of such standard processes are discussed above. The semiconductor wafer and the dielectric material are then exposed to radiation, temperatures of at least about room temperature, and an atmosphere that includes oxygen, nitrogen, at least one amine, at least one amide, at least one aldehyde, at least one aromatic compound and/or nitrogen. The dielectric material and semiconductor wafer, and any other materials deposited in and/or on the semiconductor wafer, may then be processed to form circuit features in and/or on the semiconductor wafer. The above-discussion regarding the amine, amide, aldehyde, aromatic compound and/or nitrogen exposure applies to the processes of forming the semiconductor chip devices here as well.

The addition of the at least one amine, at least one amide, at least one aldehyde, at least one aromatic compound and/or nitrogen to the process may or may not require the use of a vacuum chamber or a sub-atmospheric chamber to do the processing in addition to the controlled thermal ramping while simultaneously irradiating the wafer with UV radiation.

The present invention also includes semiconductor devices prepared according to a process that includes a process according to the present invention. A dielectric material is exposed to at least one amine, at least one amide, at least one aldehyde, at least one aromatic compound and/or nitrogen to control the dielectric constant during subsequent processing of the semiconductor wafer and the dielectric material. The discussion above regarding details of the dielectric material and the semiconductor wafer processing, including the exposure to radiation, temperatures of at least about 20° C., and/or nitrogen, at least one amine, at least one amide, at least one aldehyde, at least one aromatic compound and/or nitrogen apply here to the description of semiconductor devices according to the present invention.

The present invention also includes a treated dielectric material prepared according to a processing including exposing the dielectric material to radiation, temperatures of at least about 20° C., and/or nitrogen, at least one amine, at least one amide, at least one aldehyde, at least one aromatic compound and/or nitrogen. Once again, the above discussion regarding details of the dielectric material and the semiconductor wafer processing, including the exposure to radiation, temperatures of at least about 20° C., and/or nitrogen, at least one amine, at least one amide, at least one aldehyde, at least one aromatic compound and/or nitrogen apply here to the description of semiconductor devices according to the present invention.

Methods of photolithographically forming features in photoresists, methods of exposing photoresist, post exposure bake processes, developing processes, and methods for forming circuit features in and/or on semiconductor wafers are known. For examples of such processes, please see P. van Zant, Microchip Fabrication, McGraw-Hill, 1997, or L. Thompson, G. Willson, M. Bowden, Introduction to Microlithography, 2nd Edition, American Chemical Society, 1994, the entire contents of both of these publications are hereby incorporated by reference.

Examples of atmospheres that dielectric materials may be processed in include about 5% ammonia, about 95% nitrogen, 100% nitrogen ($N_2$) gas, about 15% $NH_3$ and about 85% $N_2$, about 15% monomethylamine and about 85% $N_2$, about 15% trimethylamine and about 85% $N_2$, and ambient air having a relative humidity of about 40%. An atmosphere including about 15% monomethylamine may have approximately the same effect as an atmosphere containing about 15% $NH_3$. Also, anywhere $N_2$ is utilized, at least one inert gas, such as helium, argon, neon, xenon, and/or krypton may also be utilized in place of or in addition to the $N_2$. Ambient air may have a humidity of from about 35% to about 55%. On the other hand, Clean Dry Air (CDA) may have a relative humidity of about 0%. The humidity level of CDA may vary by about 2% to about 3%.

As demonstrated by the Examples, various amines and/or other gases and/or vapors may be utilized according to the present invention. Additionally, the present invention also includes the introduction of at least one amine, at least one amide, at least one aldehyde, at least one aromatic compound and/or $N_2$, and/or at least one inert gas simultaneously. Alternatively, gas and/or vapor of at least one amine, at least one amide, at least one aldehyde, at least one aromatic compound and/or $N_2$, and/or at least one inert gas may be introduced at multiple times during the processing. For example, an amine could be introduced, followed by $N_2$, and then another amine. There may be some overlap in the administration of the gas(es) and/or vapor(s). Any combination of administration gas and/or vapor of the at lease one amine, at least one amide, at least one aldehyde, at least one aromatic compound and/or $N_2$, and/or inert gas may be used. In some instances, the sequence of administration of gas(es) and/or vapor(s) may be controlled to produce the desired effects with respect to the dielectric material(s).

Among the advantages of the present invention are greatly reducing or eliminating effects on the dielectric constant of dielectric materials during processes of manufacturing semiconductor devices taking place after deposition of the dielectric materials. The present invention can provide enhanced predictability in processing.

Although five different amines are described above for use in processing photoresists, any number of amines, amides, aromatic compounds and/or aldehydes may be utilized. As demonstrated by the Examples, various amines and/or other gases and/or vapors may be utilized according to the present invention. Additionally, the present invention also includes the introduction of at least one amine, at least one amide, at least one aldehyde, at least one aromatic compound and/or $N_2$, and/or at least one inert gas simultaneously. Alternatively, gas and/or vapor of at least one amine, at least one amide, at least one aldehyde, at least one aromatic compound and/or $N_2$, and/or at least one inert gas may be introduced at multiple times during the processing. For example, an amine could be introduced, followed by $N_2$, and then another amine. There may be some overlap in the administration of the gas(es) and/or vapor(s). Any combination of administration gas and/or vapor of the at least one amine, at least one amide, at least one aldehyde, at least one aromatic compound and/or $N_2$, and/or inert gas may be used.

According to some examples of the present invention, $N_2$ and $O_2$ may be used. One such embodiment utilizes about 50% $N_2$ and about 50% $O_2$.

According to other examples of the present invention, at least one amine may be administered to the processing environment. Then, at least one inert or reactive gas, such as oxygen, may be administered.

According to one embodiment of the present invention, hydrosilsesquioxane (HSQ) is exposed to UV radiation and an atmosphere that includes ammonia in a gaseous state. It is believed that this embodiment works to protect the HSQ from changes in its dielectric constant by forming a layer of ammonia on the surface of the HSQ. It is thought that the ammonia forms hydrogen bonds with a plurality of sites on the HSQ molecule as illustrated below.

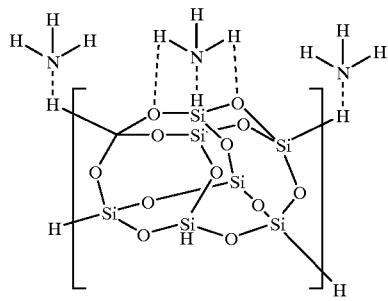

FIGS. 1 and 2 illustrate examples of two different stages during semiconductor device manufacturing processes at which the present invention could be utilized. FIG. 1 shows an example of a point at which a material having a low dielectric constant could be utilized in semiconductor device manufacturing process and be treated according to the present invention. FIG. 2 represents an example of a photostabilization process, elements of which processes according to the present invention may utilize.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method of treating a dielectric material deposited on a substrate in semiconductor device manufacturing processes, said method comprising the steps of:
    exposing the dielectric material to radiation;
    exposing the dielectric material to a temperature of 20° C. or greater; and
    exposing the dielectric material to an atmosphere that includes at least one material selected from the group consisting of an amine, an amide, at least one aldehyde, at least one aromatic compound and $N_2$;
    wherein the exposing of the dielectric material to said radiation, said temperature of 20° C. or greater and said at least one material is to a degree sufficient to substantially improve the stability of the dielectric constant of the dielectric material for subsequent processing steps.

2. The method according to claim 1, wherein the treating includes modifying the chemical structure of the dielectric material or causing a material to be deposited on the dielectric material.

3. The method according to claim 1, wherein the radiation is ultraviolet radiation produced by a microwave electrodeless light source, the light source including a lamp structure having a maximum dimension less than a wavelength of radiation produced by the light source.

4. The method according to claim 1, wherein the dielectric material being treated has a dielectric constant of at least 4.0.

5. The method according to claim 4, wherein the dielectric material is $SiO_2$, SiN, $Ta_2O_5$, or BST.

6. The method according to claim 1, wherein the dielectric material being treated has a dielectric constant of no greater than 3.0.

7. The method according to claim 6, wherein the dielectric material is SiOF, hydrosilsesquioxane, an aerogel, or nanoporous silica.

8. The method according to claim 1, wherein the manufacturing process is utilized in production of integrated circuits or flat panel displays.

9. The method according to claim 8, wherein the exposure of the dielectric material to a temperature of 20° C. or greater occurs upon an increase in at least one member selected from the group consisting of a degree of densification of the material and planarity as a result of exposure of the material to the radiation.

10. The method according to claim 1, further comprising the step of:
    exposing the material to an atmosphere including at least one member selected from the group consisting of air, at least one amine and $N_2$.

11. The method according to claim 1, wherein said at least one amine is in a form selected from the group consisting of a vapor, a gas, a mixture of gases, and a mixture of vapors.

12. The method according to claim 1, wherein said at least one amine is a primary, secondary or tertiary amine.

13. The method according to claim 1, wherein said at least one amine is selected from the group consisting of $NH_3$, $RNH_2$, $R_2NH$, $R_3N$, where R is an alkyl group including from 1 to 12 carbon atoms.

14. The method according to claim 1, wherein said dielectric material is subjected to said air, at least one amine, at least one amide, at least one aldehyde, at least one aromatic compound and $N_2$ for a time of from about 10 seconds to about 300 seconds.

15. The method according to claim 1, wherein exposure to said at least one amine results in said dielectric material being impregnated with said air, at least one amine, at least one amide, at least one aldehyde, at least one aromatic compound and $N_2$ for a time of from about 10 seconds to about 300 seconds.

16. The method according to claim 1, wherein said dielectric material is exposed to said air, at least one amine, at least one amide, at least one aldehyde, at least one aromatic compound and $N_2$ to a degree sufficient to prevent changes in the dielectric constant of the dielectric material during subsequent processing of the dielectric material or to lower the dielectric constant of the dielectric material.

17. The method according to claim 1, wherein the exposing of the dielectric material to radiation, a temperature of 20° C. or greater and an atmosphere that includes at least one material selected from the group consisting of an amine, an amide, at least one aldehyde, at least one aromatic compound and $N_2$ are carried out simultaneously.

18. The method according to claim 1, wherein the $N_2$ comes from air.

19. The method according to claim 1, wherein the radiation is ultraviolet radiation.

20. The method according to claim 1, wherein the at least one aromatic compound is benzene or a substituted benzene.

* * * * *